(12) United States Patent
Salamon et al.

(10) Patent No.: US 9,557,118 B2
(45) Date of Patent: Jan. 31, 2017

(54) COOLING TECHNIQUE

(71) Applicant: LGS Innovations LLC, Herndon, VA (US)

(72) Inventors: Todd R Salamon, Murray Hill, NJ (US); Brijesh Vyas, Florham Park, NJ (US); Krishna Kota, New Providence, NJ (US); Elina Simon, Murray Hill, NJ (US)

(73) Assignee: LGS INNOVATIONS LLC, Herndon, VA (US)

( * ) Notice: Subject to any disclaimer, the term of this patent is extended or adjusted under 35 U.S.C. 154(b) by 665 days.

(21) Appl. No.: 13/630,311

(22) Filed: Sep. 28, 2012

(65) Prior Publication Data

US 2014/0090815 A1    Apr. 3, 2014

(51) Int. Cl.
| | | |
|---|---|---|
| F28D 15/00 | (2006.01) | |
| F28D 15/02 | (2006.01) | |
| F28D 15/04 | (2006.01) | |
| H01L 23/427 | (2006.01) | |

(52) U.S. Cl.
CPC ......... *F28D 15/0266* (2013.01); *F28D 15/046* (2013.01); *H01L 23/427* (2013.01); *H01L 2924/0002* (2013.01)

(58) Field of Classification Search
CPC ............................. F28D 15/0266; F28D 15/046
USPC ..................................................... 165/104.26
See application file for complete search history.

(56) References Cited

U.S. PATENT DOCUMENTS

| | | | |
|---|---|---|---|
| 6,533,029 B1* | 3/2003 | Phillips ..................... 165/104.26 | |
| 7,188,662 B2* | 3/2007 | Brewer et al. .............. 165/80.4 | |
| 7,796,389 B2* | 9/2010 | Edmunds et al. ............ 361/700 | |
| 7,931,072 B1* | 4/2011 | Kroliczek et al. ........ 165/104.26 | |
| 7,980,295 B2* | 7/2011 | Takamatsu et al. ..... 165/104.26 | |
| 8,246,902 B2* | 8/2012 | Hou ................................. 419/6 | |
| 2002/0144802 A1 | 10/2002 | Jairazbhoy et al. | |
| 2003/0106671 A1 | 6/2003 | Chu et al. | |
| 2009/0159243 A1* | 6/2009 | Zhao ..................... F28D 15/046 165/104.26 | |
| 2011/0088875 A1* | 4/2011 | Hou ......................... 165/104.26 | |
| 2011/0120674 A1* | 5/2011 | MacDonald et al. ..... 165/104.26 | |
| 2011/0284188 A1* | 11/2011 | Cai et al. .................. 165/104.26 | |
| 2012/0043060 A1 | 2/2012 | Wang et al. | |
| 2012/0305222 A1* | 12/2012 | Yang et al. ............... 165/104.26 | |
| 2013/0032312 A1* | 2/2013 | Wang ........................ 165/104.26 | |
| 2013/0223010 A1* | 8/2013 | Shioga et al. ................ 361/700 | |

FOREIGN PATENT DOCUMENTS

WO    2012046338 A1    4/2012

OTHER PUBLICATIONS

Foreign Communication From a Related Counterpart Application, PCT Application No. PCT/US2013/060550, International Search Report and Written Opinion dated Dec. 17, 2013, 11 pages.

* cited by examiner

*Primary Examiner* — Devon Russell (74) *Attorney, Agent, or Firm* — Baker and Hostetler LLP (57) ABSTRACT

An apparatus and a method are provided. Use is made of a wick structure configured to receive a liquid and generate vapor in when such wick structure is heated by heat transferred from heat sources to be cooled off. A vapor channel is provided configured to receive the vapor generated and direct said vapor away from the wick structure. In some embodiments, heat conductors are used to transfer the heat from the heat sources to the liquid in the wick structure.

16 Claims, 6 Drawing Sheets

COOLING TECHNIQUE

STATEMENT OF GOVERNMENT INTEREST IN THE INVENTION

The present application was made with government support under Department of Energy Grant No. DE-EE0002B95. The United States government may have certain rights in the invention.

TECHNICAL FIELD

The present disclosure is directed, in general, to a cooling apparatus and method for an electronic component.

BACKGROUND

Electronic components have continued to increase in device density. The increase in device density typically gives rise to an increase in volumetric heat generation. This fact may reach a point where increased volumetric heat generation may create what can be called a "thermal bottleneck" that may seriously limit continued increases in the performance of the components or the equipment concerned.

SUMMARY

Some embodiments of the disclosure relate to a device including a wick structure and a liquid supply source. The wick structure is configured to absorb liquid from the liquid supply source. As a consequence of receiving heat from a heat source, the wick structure is configured to generate vapor from the absorbed liquid. The device further includes a vapor return channel configured to provide a path for conducting the generated vapor away from the wick structure.

Some embodiments of the disclosure relate to a method. According to the method, a wick structure absorbs liquid from a liquid supply source. As a consequence of receiving heat from a heat source, the wick structure generates vapor from the liquid absorbed. The vapor generated is then conducted away from the wick structure using a vapor return channel.

BRIEF DESCRIPTION OF THE DRAWINGS

Reference is now made to the following descriptions taken in conjunction with the accompanying drawings, in which.

DETAILED DESCRIPTION

It is realized herein that, in view of the above tendency to increased volumetric heat generation, efficient heat transfer techniques capable of addressing the above heat generation problems are desirable.

A number of approaches have been proposed directed to improving heat transfer from the heat generating components, such as the junction of transistors within the electronics of a device, to a heat absorption environment, such as the ambient.

However, the current improvement in heat transfer capabilities does not appear to be at a pace sufficient to satisfy the growing demand for heat transfer as a result of the increased device density. This situation may, in particular create a growing gap between the heat transfer capabilities of current chip-level thermal management solutions and the chip-level heat densities, which are approaching about 1 kW/cm^3. This "thermal bottleneck" may be better illustrated by the observation that, in a typical high-performance chip, approximately 1 mg of material may be used for the transistors performing the computation, 1 g of material may be used for the electrical interconnects, and 1 kg of material may be used for the thermal management solution (the numerical values are provided for illustration purposes only and may vary from device to device). New thermal management technologies are thus needed that are capable of addressing heat dissipation in a more efficient manner.

Attempts have been made toward providing solutions to the above problem. One such existing solution relates to making use of a combination of technologies to improve heat transfer from the junction of the devices within a chip to the ambient. This approach typically includes: i) using high thermal conductivity materials within the chip that enhance heat transfer from the electronic devices to the package of the chip as well as heat spreading elements to reduce the effect of hot spots (a hot spot within the context of this disclosure refers to a physical location on the structure of the device where heat generation is substantially higher than the areas in the vicinity of that physical location; ii) using a low-thermal-resistance thermal interface material to thermally connect the chip to a heat spreader; iii) using an efficient heat spreader, such as a vapor chamber, to allow dissipation of the heat over a greater surface area; iv) attaching or integrating a high-performance heat sinking solution, for example, a heat sink with an integrated fan, to reject heat to the ambient environment.

The term chip within the context of the present disclosure may refer to any element including a miniaturized electronic, optical or opto-electronic circuit, including but not limited to integrated circuits manufactured on semiconductor materials or compounds thereof, crystals, polymers, metals or organic semiconductors.

Although the above known solution contributes to improving thermal dissipation in or from the chip, the thermal bottleneck from the on-chip devices to the package of chip is often not overcome.

In an attempt toward providing a viable solution to continue along the principles of Moore's law, for example on a single core CPU, addressing the thermal density problem at chip-level as described above may therefore be increasingly desirable.

One additional frequent problem associated with the known solutions that use liquids to cool heat sources is the creation of bubbles which would typically impair the efficient performance of the device. Some embodiments disclosed herein attempt to provide cooling solutions which avoid or at least reduce the creation of bubbles. In this regards, some embodiments of the disclosure are aimed at maintaining the heat transfer process within the so-called evaporation regime. Evaporation regime in the context of the present disclosure relates to a regime of heat transfer in which a liquid is used for cooling a heat source such that as a consequence of receiving heat, the liquid evaporates and thus produces a cooling effect without reaching a boiling point where bubbles are produced. Although maintaining the heat transfer process within evaporation regime is desirable, it is not the only condition in which an apparatus as disclosed herein may be capable to provide satisfactory results. Indeed, in some cases, as will be pointed out further below, there may exist a possibility of operating in the so-called boiling regime (as opposed to evaporation regime) in which bubbles may be produced but the cooling process provided by the apparatus may still be satisfactory.

According to the embodiments disclosed herein, thermal management at chip-level may be addressed by incorporating structures within the chip that allow controlled evaporation of a fluid to occur near the high-heat-density components. Liquids typically have a large latent heat of vaporization which is a measure of the enthalpy difference between the gas phase and the liquid phase (of the same substance). For example R134a has $\Delta H_{vap}$ of about 215 J/g at 1 atm; butane has $\Delta H_{vap}$ of about 385.6 J/g and water has $\Delta H_{vap}$ of about 2257 J/g. This property gives liquids tremendous potential for heat removal. This principle is used for example in modern refrigeration systems.

Another benefit of using evaporation is that the phase change process can be controlled at a near-isothermal temperature by controlling the operating pressure of the system. This has the advantage that by keeping the cooling liquid at a near-isothermal temperature it may become possible to maximize the cooling capability of the cooling liquid; for example, given constraints on pumping capacity and pressure drop within the system. Considering the incoming temperature of the liquid as the reference temperature, if one were to rely on single-phase cooling using, e.g. liquid water as is the case in some known devices, the liquid water would need to heat up to absorb heat from the heat source. However, for relatively low flow rates of water, this temperature rise can be substantial, which in turn increases the temperature of the cooling medium and consequently makes the heat source hotter. This problem may be addressed by having very high flow rates of liquid water to reduce the temperature rise of the liquid water. However, this solution would typically require a large pump to drive the high flow rates of the liquid water, which is also undesirable. In contrast, by relying on vaporization of the liquid and maintaining the heat transfer within the evaporation regime as proposed herein, the liquid temperature remains substantially at a constant level, hence avoiding temperature rise of the cooling medium.

Figure 1A:
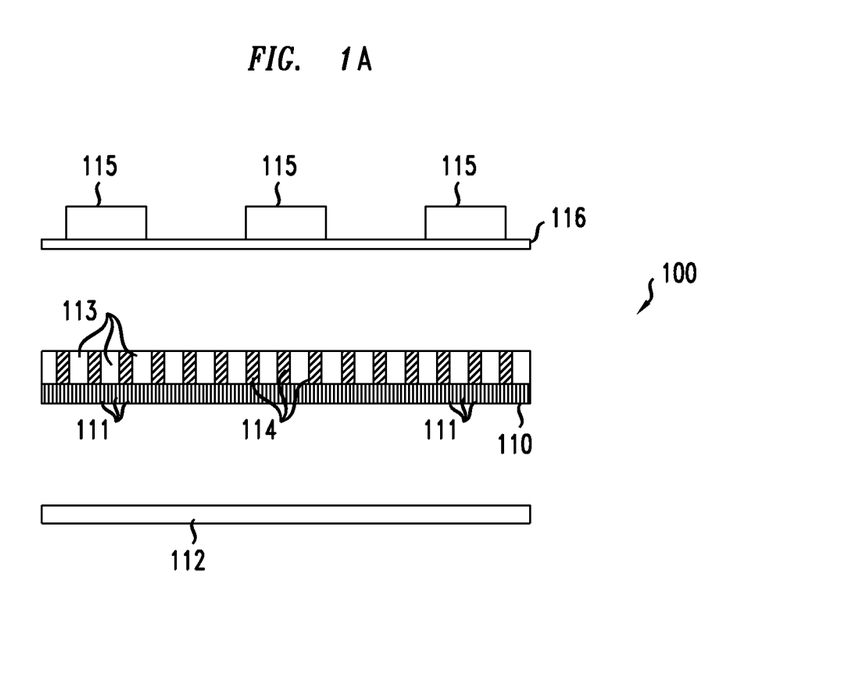
FIGS. 1a and 1b are exemplary representations of schematic cross-sectional views including a structure according to some embodiments.
Figure 1B:
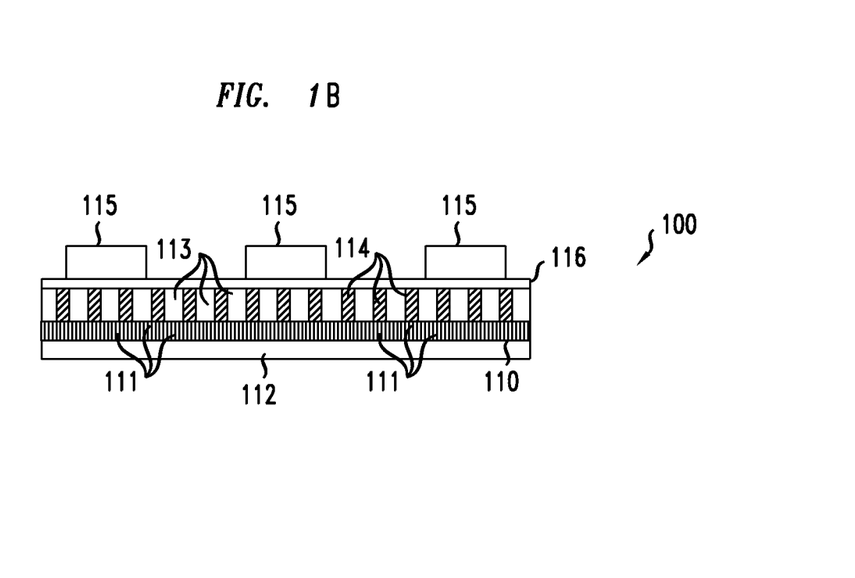

Referring to FIG. 1a an exemplary schematic representation of a cross-sectional view including a structure according to some embodiments is shown. The structure 100 includes a wick structure 110. In the example of FIG. 1a and FIG. 1b the wick structure includes a plurality of capillary media 111.

The term capillary, as used herein, is known in the art. As a non-limiting description of the same, this term may be understood to relate to an effect according to which a liquid flows inside a narrow space, i.e. a capillary medium, when the liquid and the narrow space are placed in contact with each other, without the need of using an external force to cause such flow of the liquid inside the narrow space. Such narrow space may be, but is not limited to, a narrow space, or interstice, provided between elongated fiber-shaped bodies positioned contiguous to each other such as a bundle of bristles in a paint-brush; or a narrow space provided inside a body such as one provided inside a hollow cylinder. Herein, the action caused by such effect may be referred to as capillary action and the narrow space may be referred to as a capillary medium, be it inside a hollow body or between contiguous bodies as described in the above examples.

Referring back to the example of FIG. 1a, the capillary media 111 of the wick structure 110 are capable of performing a capillary action when such capillary media are placed in contact with a liquid in a liquid supply source (or plenum) 112. The liquid may be for example water.

The capillary media may be for example in the form of cylindrical or prismatic pores within a substrate having hollow interior spaces. For example elements represented by reference numeral 111 in FIG. 1a may be in the form of such cylindrical or prismatic pores within the wick structure represented by reference numeral 110. Alternatively the capillary media may be defined by means of narrow spaces provided between adjacent elongated bodies such as solid fiber-type posts. In some embodiments capillary media may be defined by means of a hollow space provided between two adjacent bodies of heat conductors as will be described further below with reference to FIGS. 3a and 3b.

It is to be noted however that the above cylindrical and prismatic shapes for the pores are only provided as examples and other structures may also be used as appropriate. For example, in sintered structures one may use conical pores; or in porous silicon, one may have randomly interconnected pores of differing size and shape in all three dimensions.

The structure 100 further includes one or more channels 113 for the return or ejection of vapor. Channels 113 may be provided adjacent to the capillary media 111 as shown in FIG. 1a. Channels 113 may be formed in any convenient manner. In the example of FIG. 1a, channels 113 may be included by the space provided between adjacent heat conductors 114.

The structure 100 of the exemplary embodiment of FIG. 1 includes a plurality of heat conductor structures (or heat conductors) 114. The heat conductors 114 are intended to provide a path for the heat transfer from the heat source 115 to the wick structure 110, when such heat conductors are brought into thermal contact with one or more heat sources 115.

Heat conductors 114 may be made of any known material capable of providing heat transfer (i.e. having negligible or low resistance to the conduction of heat). Examples of such materials may be metals such as aluminum, copper, nickel, gold or silver; or semiconductors such as silicon, silicon carbide, or carbon-based materials such as graphite, diamond and amorphous carbon. Preferably the heat conductors 114 are solid structures to ensure improved heat transfer.

The heat conductors 114 may have any suitable shape, which may be designed according to the specific needs of each application. For example the heat conductors may be made in the form of pillars.

One or more heat sources 115 may be brought into thermal contact with a heat spreader 116 to spread the heat throughout a wider surface. The use of a heat spreader however is not mandatory. Heat spreader 116 may be of any known type with thickness and a thermal conductance appropriate for the required use.

Referring now to FIG. 1b, the structure 100 as described with reference to FIG. 1a is shown assembled with other elements to perform heat dissipation. In FIG. 1b, like elements have been given like reference numerals as those of FIG. 1a. As shown in FIG. 1b, the structure 100 is assembled together with the liquid supply 112, heat sources 115 and the heat spreader 116. Heat sources 115 may be any electronic components or chips to be cooled off as described further above.

In operation, heat generated by the heat sources 115 is optionally first transferred to the heat spreader 116. Heat conductors 114 receive the heat from heat spreader 116 and transfer the heat along or through the body of the heat conductors 114. In this example the heat conductors may be assumed to be solid pillars made of metal. As a result heat is transferred from heat spreader 116 to the wick structure 110 via the heat conductors 114.

The wick structure 110 is in turn in contact with a liquid supply plenum 112. In FIG. 1b the liquid supply plenum is located at a side opposite to the side where heat conductors make contact with the wick structure.

Liquid from the liquid supply plenum 112 may be fed to the wick structure including the capillary media 111 by two potential effects. One effect may be produced by using a pump which supplies the liquid to the liquid supply plenum 112 and the capillary media 111. Another effect may be based on capillary forces where either one by itself or in combination produce a negative pressure differential that transports liquid from the plenum 112 into the capillary media. The two mentioned effects may also be used in combination.

Once the liquid flows into a capillary medium, the liquid reaches the vicinity of the heat conductors 114 and evaporates due to the heat received from a heat conductor 114. This phase change, i.e. liquid to vapor, contributes to reducing the temperature (cooling off) the respective heat conductor 114.

Figure 4A:
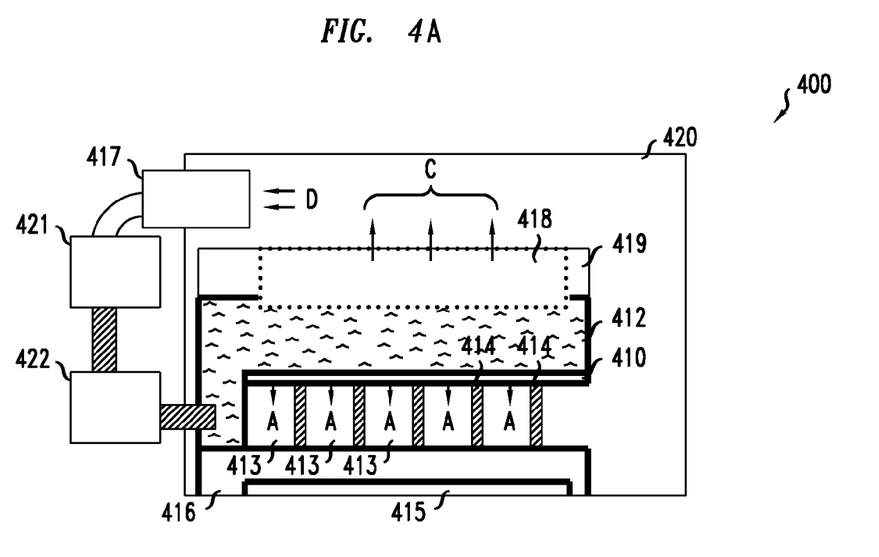
FIGS. 4a, 4b and 4c are respective exemplary representations of schematic front view, top view and side view of a structure according to some embodiments.

It is to be noted that in transporting heat in the overall system various temperature drops within the system may be involved. As a non-limiting example one may consider temperature drops through the heat conductors 114, within the wick structure 110, across the thin liquid layer in the wick structure, between the liquid/vapor interface and a condenser (for example element 421 in FIG. 4). Therefore, the overall thermal resistance (R) between the device and the condenser may be expressed in units of C/W as follows:

$$R\_device\_to\_condenser = R\_heat\_spreader + R\_conductors + R\_wick + R\_liquid\_film + R\_interface + R\_vapor\_to\_condenser.$$

The above parameters may therefore be taken into account upon designing a device to reduce as much as possible the overall temperature resistance in the device.

In this manner, heat is transferred from the heat sources 115 to the liquid (which evaporates) thereby cooling off the heat sources.

In the exemplary embodiment of FIGS. 1a and 1b, the wick structure 110 is located between the heat sources 115 (also the heat conductors 114) and the liquid supply source 112. This configuration avoids a direct contact between of the liquid supply source 115 with the heat sources 115 and therefore eliminates or substantially reduces the creation of bubbles, which otherwise may eventually result in a liquid dry-out condition (especially for high heat fluxes) at the heat sources 115. In this configuration it may be considered that the apparatus may normally operate under evaporation regime.

Vapor generated as a result of the evaporation of the liquid, typically at the liquid/vapor interface within the wick structure, may then leave the wick structure via vapor return or ejection paths provided by channels 113 that are between the heat conductor pillars 114. One example of providing vapor return path is provided further below with reference to FIG. 4.

The direction of flow of the liquid and the vapor may be determined as convenient and according to the specific design requirements. In any case, the liquid and the vapor may not necessarily flow in the same direction.

Figure 2A:
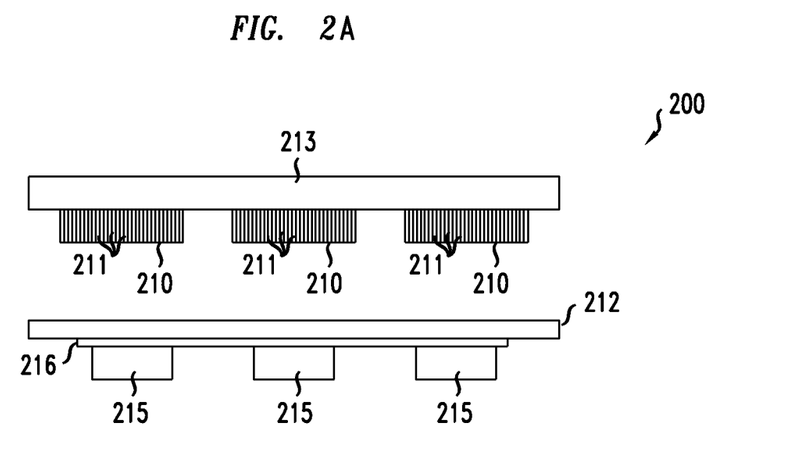
FIGS. 2a and 2b are exemplary representations of schematic cross-sectional views including a structure according to some embodiments.

Referring now to FIG. 2a an exemplary schematic representation of a cross-sectional view including a structure according to some alternative embodiments is shown.

The structure 200 includes one or more wick structures 210 (three shown). The wick structures 210 each include a plurality of capillary media 211.

The capillary media 211 of the wick structures 210 are capable of performing a capillary action when such capillary media are placed in contact with a liquid 212.

The structure 200 further includes a channel 213 for vapor return. Channel 213 may be provided adjacent to the capillary media 211 as shown in FIG. 2a. Alternatively channel 213 may be separated from the capillary media 211 and brought into contact therewith during operation.

Channel 213 may be formed in any convenient manner. In the example of FIG. 2a, channel 213 may include the entire space provided adjacent to the wick structures 210. In the example shown in FIG. 2a, one single channel 213 is placed above the wick structure 210. However other positions and configurations of the channel 213 adjacent the wick structures 210 may likewise be envisaged. For example, separate channels may be placed on each wick structure.

As shown in FIG. 2a, differently from the structure of FIGS. 1a and 1b, wick structures 210 are placed above heat sources 215 and are fed by liquid from the supply plenums 212 located preferably on one or various sides of the wick structures 210. In some embodiments the liquid from the supply plenums 212 may be located under the wick structures 210. The wick structure 210 may be made of capillary media 211 having large capillary force. Some non-limiting examples of such capillary media may be silicon nanograss, carbon nanotubes, metal nano/micrograss, porous silicon and sintered metal powder. The small-sized features of the wick structures 210 may allow large capillary forces to be generated which cause the liquid to flow into the wick structures 210 and allow controlled evaporation.

The structure 200 may then be used for cooling the heat sources 215 as will be described with reference to FIG. 2b. Heat sources 215 may optionally be provided with a heat spreader 216.

Differently from the structure 100 of the embodiment of FIG. 1a and FIG. 1b, the structure 200 of FIG. 2a (and also FIG. 2b) may be made without heat conductors. The absence of heat conductors may be advantageous in cases where size is of significance. The absence of heat conductors may also be advantageous as it may help to reduce thermal resistance in the device and temperature gradient between heat source and the liquid.

Figure 2B:
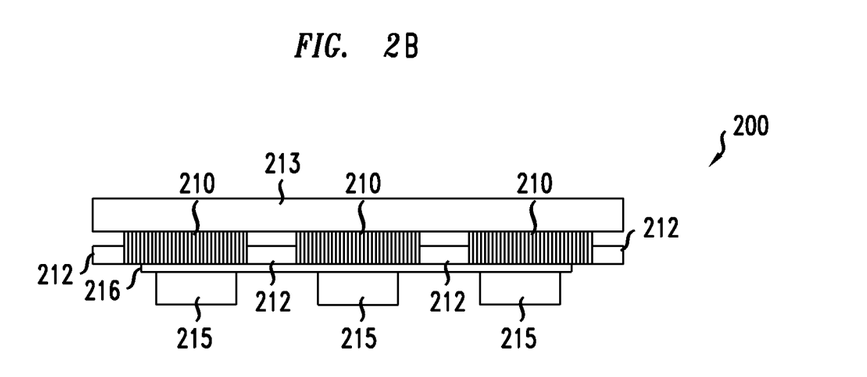

Referring now to FIG. 2b, the structure 200 as described with reference to FIG. 2a is shown assembled with other elements to perform heat dissipation. In FIG. 2b, like elements have been given like reference numerals as those of FIG. 2a. As shown in FIG. 2b, the structure 200 is assembled together with the liquid supply plenum 212, heat sources 215 and the heat spreader 216. Heat sources 215 may be any electronic components or chips to be cooled off as described further above.

The vapor return channel 213 is located above the wick structures 210 to efficiently remove the vapor from wick structures 210. In this configuration, the liquid supply plenum 212 may supply liquid from the side of the wick structures 210, as shown in FIG. 2b, or from the top of the wick structures 210 (not shown). Optionally, an insulating material, such as SiO2 may be placed in regions near the heat sources 215 where it is desirable to avoid or at least substantially reduce transfer of heat from the heat sources 215 directly to the liquid supply plenum 212. This may help avoid or reduce the creation of bubbles.

In operation, heat generated by the heat sources 215 is optionally first transferred to the heat spreader 216. Heat may then be transferred from the heat sources 215 toward the wick structure 210. As mentioned above, the use of an insulating material placed in regions near the heat sources 215 may help avoiding the creation of bubbles in the liquid supply source. In this manner, the liquid supply source may remain cooler where it is not needed to be heated up and as the liquid approaches the wick structure 210 it may absorb increasing amounts of heat such that at the point where the liquid reaches the capillary media it may evaporate and thereby complete the cooling process.

As the wick structure 210 is in contact with the liquid 212, liquid from the liquid supply plenum 212 flows into the porous wick structures 210 including the capillary media 211 in a similar fashion as that described in relation to FIGS. 1a and 1b. In the present example liquid may flow into the capillary media 211 from the sides of the wick structures 210.

Once the liquid is flown inside a capillary medium 211, it is at the same time in the vicinity of an area close to the position of the heat sources on the opposite side of the liquid supply plenum 212. Therefore, due to an increased level of heat present in said area, the liquid evaporates. This phase change, i.e. liquid to vapor, contributes to reducing the temperature (cooling off) of said area close to the position of the heat sources, thereby contributing to cooling off the heat sources 215.

Vapor generated as a result of the evaporation of the liquid, typically at the liquid/vapor interface within the wick structure, may then leave the wick structures via channel 213 located above the heat wick structures 210. One example of providing vapor return path is provided further below with reference to FIG. 4.

In similar fashion to FIGS. 1a and 1b, the direction of flow of the liquid and the vapor in the example of FIGS. 2a and 2b may be determined as convenient and according to the specific design requirements. Therefore, in this example the liquid and the vapor may flow in or out of the plane of the figure, or alternatively, the liquid and the vapor may flow from left to right or from right to left as one looks at the figure. A combination of the above options may also be envisaged for the directions of flow of the liquid and the vapor. In any case, the liquid and the vapor may not necessarily flow in the same direction.

It may be appreciated that in the exemplary embodiment of FIGS. 2a and 2b, there is no specific insulating separation shown between the liquid supply source 212 and the heat sources 215. In this configuration bubbles may be created (even with the use of insulating layers of SiO2 as mentioned above) proximate to the capillary media 211, where temperature is higher; however such bubbles would not significantly affect the performance of the device because the bubbles created are converted into vapor at the very vicinity of the capillary media 211 and thus may easily leave the wick structure without causing vapor conduction blockage on the heat source 215. In this configuration, therefore, the apparatus may operate either in the evaporation regime (avoiding the creation of bubbles) or in the boiling regime in which bubbles are created, as they are created away from the heat sources 215.

Figure 3A:
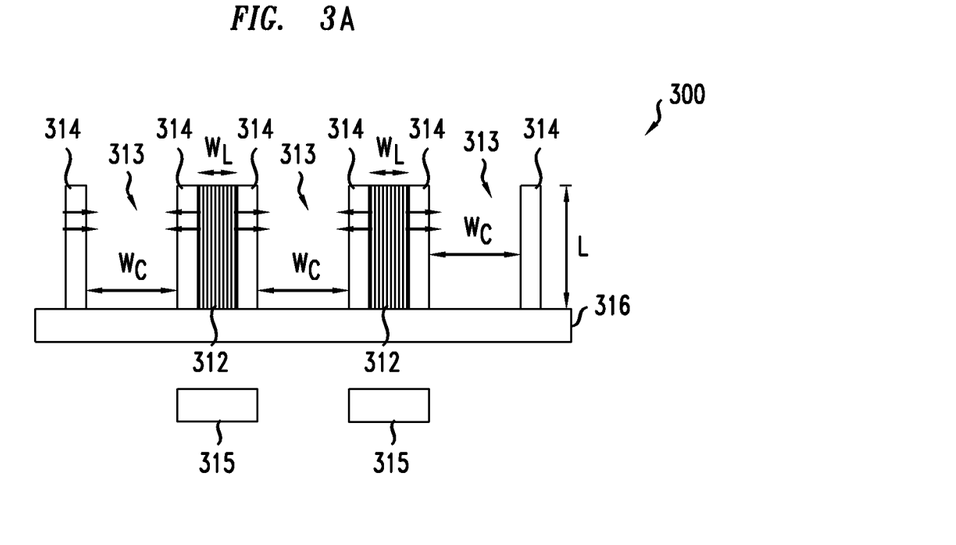
FIGS. 3a and 3b are respective exemplary representations of schematic front view and side view, orthogonal to the front view, of a structure according to some embodiments.
Figure 3B:
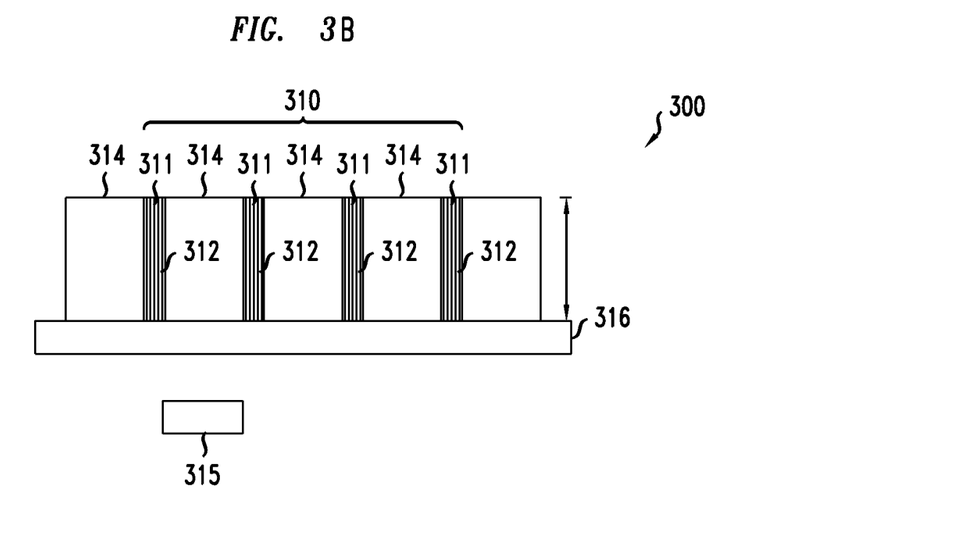

Referring now simultaneously to FIGS. 3a and 3b exemplary schematic representations respectively of a front view and a side view of a structure according to some alternative embodiments are shown.

The structure 300 includes a wick structure generally shown by reference numeral 310. The wick structure 310 includes a plurality of capillary media 311.

The capillary media 311 of the wick structure 310 are capable of performing a capillary action when such capillary media are placed in contact with a liquid 312.

The structure 300 further includes channels 313 (not shown in FIG. 3b). Channel 313 may be formed in any convenient manner. In the example of FIGS. 3a and 3b, channels 313 may be included by the space provided between two adjacent heat conductors 314. The heat conductors preferably have the shape of a plane body such as a plate thus may also serve the purpose of forming walls for the channels 313.

In the exemplary embodiment of the FIGS. 3a and 3b, the capillary media 311 are provided within (as in the case of porous silicon) and/or between the bodies of the heat conductors 314, which form the walls of the channels 313.

In some embodiments the heat conductors may themselves have a porous structure for example by using porous silicon, or the heat conductors may be made using sintered metal powder, such as copper powder. In such cases the heat conductors and the wick structure form part of the same structure, while having different functions; namely the primary function of heat conductors is transferring heat away from the heat sources through conduction while the primary function of wick structure is absorbing heat from the heat conductors thereby efficiently transporting the heat to the liquid-vapor interface.

Wick structure 310 may be placed above heat sources 315 and are fed by liquid from the liquid supply plenums 312.

As shown in FIGS. 3a and 3b, the liquid supply plenums 312 are formed by the spaces provided between two adjacent heat conductors 314. In operation, the liquid supply plenums 312 are configured to contain or convey liquid to be used for evaporation.

Therefore, both channels 313 and liquid supply plenums 312 are formed between heat conductors 314 which act as walls for such spaces. However whereas a channel 313 is formed between a first heat conductor 314 and a second heat conductor 314 immediately next to the first heat conductor, a liquid supply plenum is formed between said second heat conductor 314 and a third heat conductor 314 immediately next to the second heat conductor and these structure may be successively repeated as shown more clearly in FIG. 3a (showing three channels and two liquid supply plenums).

The width $W_C$ of the channels 313 may be larger than the width $W_L$ of the liquid supply plenums 312. This allows the use of wider spaces for vapor ejection thereby improving performance.

The heat conductors 314 may be provided on a support substrate 316. Optionally the support substrate may be a heat spreader.

The structure 300 may then be used for cooling the heat sources 315. Heat sources 315 may be any electronic components or chips to be cooled off as described further above.

Preferably a cover (not shown) may be used above the channels 313 and the heat conductors 314 (e.g. on the top edges of the heat conductors as shown in FIGS. 3a and 3b)

to contain the flow of the liquid within the channels 313 and avoid possible spill-over of the liquid therefrom.

In operation, when heat sources 315 are brought into contact with the structure 300 (in FIGS. 3a and 3b, heat sources are shown at a distance from the structure 300 and may be brought into contact with each other), heat generated by the heat sources 315 may be transferred from the heat sources 315 toward the heat conductors 314 which also form the liquid supply plenums 312 (optionally with a heat spreader used between the heat sources and the liquid supply plenums 312).

Assuming that liquid is present (or is made to flow) in the liquid supply plenums 312, liquid flows into the capillary media 311 of wick structure 310 in a similar fashion as that described in relation to FIGS. 1a and 1b. In the example shown in FIG. 3b, liquid is shown to be present inside the capillary media 311 up to certain level L. This level L of the liquid in the capillary media 311 may be higher than the level of the liquid present inside the liquid support plenums 312 (this level is not shown), the difference in level being due to the capillary action within the capillary media 311. Although, for the sake of simplicity of illustration, the level of liquid in the liquid supply plenum is not shown in FIG. 3b, those skilled in the related art will realize that the liquid supply plenum contains at least some level of liquid present therein to allow proper operation of the device.

Once the liquid is flown inside a capillary medium 311, the liquid is heated as a result of the heat present in the heat conductors 314 which have absorbed and spread the heat from heat sources 315. Due to the increased level of heat received from the heat conductors, the liquid inside the capillary medium 311 evaporates. This phase change, i.e. liquid to vapor, contributes to reducing the temperature (cooling off) of the respective heat conductor 314 thereby contributing to cooling off the heat sources 315.

Vapor generated as a result of the evaporation of the liquid, typically at the liquid/vapor interface within the wick structure, may then leave the wick structure via channel 313. As shown the FIG. 3a, the vapor may be made to flow in the direction of arrows shown on the heat conductors 314, namely toward the respective return channels 313 next to each heat conductor 314. One example of providing vapor return path is provided further below with reference to FIG. 4.

The direction of flow of the liquid and the rejection of the vapor in the example of FIGS. 3a and 3b may be determined as convenient and according to the specific design requirements. Therefore, in this example the liquid and the vapor to be rejected may flow in or out of the plane of FIG. 3a which may be the same as flowing from left to right or from right to left as one looks at FIG. 3b. A combination of the above options may also be envisaged for the directions of flow of the liquid and the vapor. In any case, the liquid and the vapor may not necessarily flow in the same direction.

An insulating material such as SiO2 may be placed on the surface of the heat sources 315 adjacent to the liquid supply plenums 312 to reduce the potential for boiling to occur in the liquid. Alternatively an insulating material such as SiO2 may be placed on a surface below the liquid adjacent to the areas where the heat sources are placed.

Additionally, it may be possible to use surface treatment to tailor the wetting properties of the surfaces. The coating would likely need to increase the wetting of the liquid. It may hence be chemical, or also change the local roughness of the surface, or a combination of the two. Wetting properties of surfaces may be modified by chemical treatment or causing physical changes through machining or microfabrication methods.

Furthermore, this embodiment increases the surface area of the wick structures (the plurality of capillary media), as compared to the embodiments according to FIGS. 1a and 1b, by orienting the capillary media along a width of the heat conductors, thereby more surface contact is made possible provided that appropriate dimensioning of the heat conductors is observed.

In the exemplary embodiment of FIGS. 3a and 3b, similar to that of FIGS. 2a and 2b, there is no specific insulating separation shown between the liquid supply source 312 and the heat sources 315. In this configuration also, bubbles may be created proximate to the capillary media 311, where temperature is higher; however the apparatus may be designed in such a manner that such bubbles would not significantly affect the performance of the device. For example, the heat conductors 314 may be designed to cover locations which are in the vicinity of the heat sources 315. In this manner bubbles may be created mainly at locations nearby the capillary media 311 and thus may easily leave the wick structure without causing vapor conduction blockage. In this configuration also, the apparatus may operate either in the evaporation regime (or in the boiling regime in which bubbles are created, as they are created away from the heat sources 215.

In either cases of operation, i.e. under boiling regime or evaporation regime, the apparatus may be designed to operate using a thin film of liquid in the wick structure. Such thin film of liquid may be determined according to the specific design and the intended application of the apparatus. Some non-limiting values for a thin film of liquid may be in a range at or below about 10 microns, preferably about 1 micron or even more preferably in a range between 50 to 100 nm in depth (thickness of the film).

Furthermore, a low amount of superheating, defined as the difference between the temperature of the heated liquid relative to its saturation temperature may be provided across the liquid to reduce boiling in the liquid. In the context of the present disclosure, the term "low" may be determined by the skilled person depending on the type of liquid, surface material, roughness and operating pressure. An exemplary value for such a low temperature may be in range of about 5 degrees C. or lower.

Figure 4B:
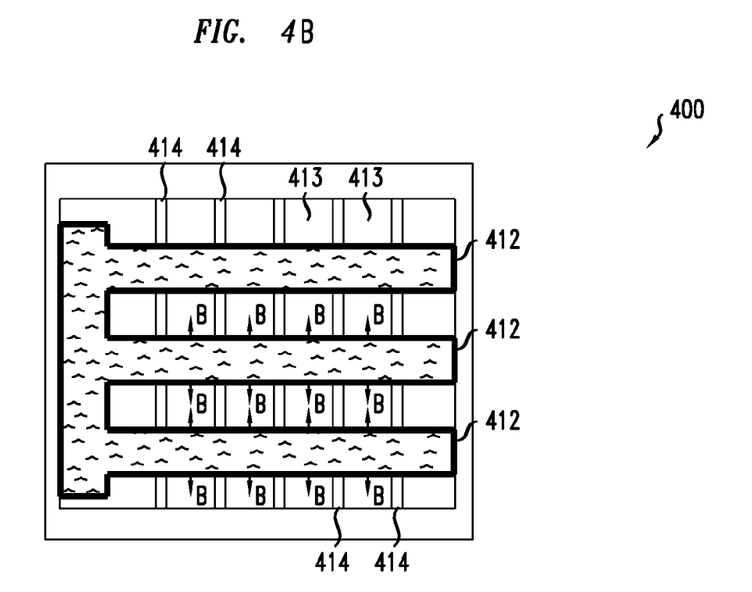
Figure 4C:
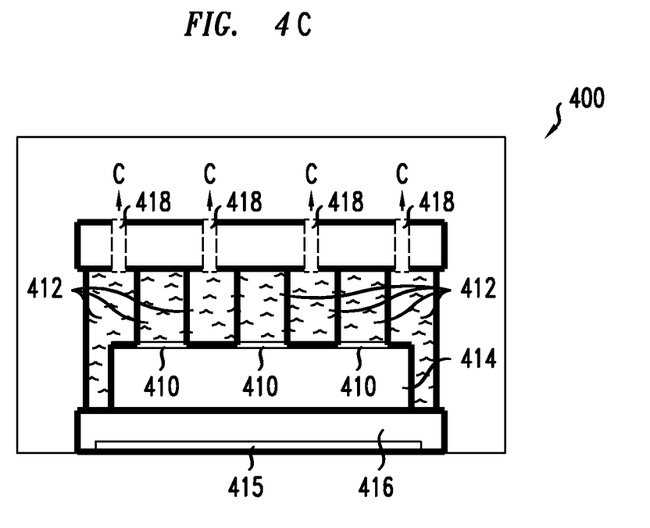
Figure 4D:
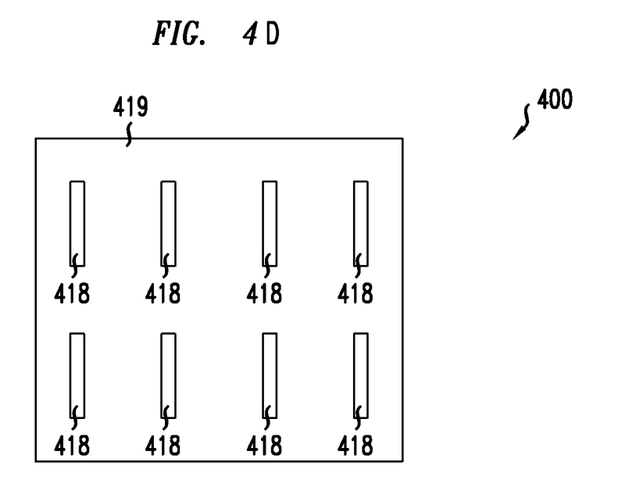
FIG. 4d is an exemplary representation of a top view of a cover plate for use w the structure of FIGS. 4a, 4b and 4c.

Referring now simultaneously to FIGS. 4a, 4b and 4c respective exemplary representations of schematic front view, top view and side view of a structure according to some embodiments will be described.

In this representation, the principle of operation of the structure may be according to any one of the embodiments previously described with reference to FIGS. 1a-1b; 2a-2b and 3a-3b. In the embodiment of FIGS. 4a, 4b and 4c however, an example of providing vapor return path will be described.

The structure 400 includes one or more wick structures 410. The wick structure 410 may include any convenient form with similar liquid absorption properties as discussed above with reference to the previous embodiments of the present disclosure.

The structure 400 further includes one or more liquid supply sources 412, an array of heat conductors 414 and one or more channels 413 for vapor return. The channel may be formed for example between the heat conductors 414.

The wick structure 410 may be positioned above and may be brought in thermal contact with the array of heat conductors 414. The heat conductors 414 in turn may be brought in thermal contact with a heat source 415. Here again a heat spreader 416 may optionally be used to spread the heat from the heat source 415.

FIGS. 4a, 4b and 4c show the above elements in assembled position to facilitate the description of the vapor return mechanism.

In operation, the heat generated from the heat source 415 is transferred (with or without a heat spreader in-between) to the array of heat conductors 414. The heat conductors 414 transfer the heat to the wick structure 410 with which they are in (or brought into) thermal contact.

The wick structure 410 is in turn in contact with the liquid supply plenum 412 and therefore absorbs liquid from the liquid plenum in a similar fashion as that described in relation to FIGS. 1a and 1b.

As a consequence of the heat transferred from the heat conductors 414 to the wick structure 410 including absorbed liquid therein, the liquid inside the wick structure evaporates and moves toward the channels 413 as schematically shown in FIG. 4a by arrows A. The vapor conducted away from the wick structure 410 then moves (or is conducted) toward regions where the wick structure is not present so that the vapor may continue to flow toward the output 417. This action is schematically shown in FIG. 4b by arrows B.

Once the vapor clears into the open regions as shown by arrows B, it may flow toward the output 417 as shown by arrows C in FIG. 4a. In doing so, the vapor may pass through holes 418 provided within the body of a cover plate 419 located above the entire structure. The use of the cover plate 419 however is optional.

In some embodiments in which a cover plate is used, the cover plate may act as one of the surfaces enclosing the inlet plenum; this configuration may be advantageous from a microfabrication perspective.

Once the vapor reaches the space 420 in the vicinity of the output 417, it may be directed out of the apparatus as schematically shown by arrows D.

In this manner, the channels 413 provide a path to conduct the vapor away from the wick structure 410.

The driving force for vapor return out of the device may be provided either by using known means or by using the solution described below with continued reference to FIG. 4.

To drive the vapor out of the device, use may be made of a condenser region 421, such as a water-cooled cold plate, where the vapor condenses at a lower saturation temperature. For simplicity of illustration, the condenser is only shown in FIG. 4a, as additional illustration in FIGS. 4b and 4c are considered not necessary for the understanding of the present disclosure.

The liquid so condensed may then be fed into a pump 422 which may redirect the condensed liquid into the liquid supply source 412 by appropriate pump action.

The lower pressure associated with the lower saturation temperature may create a pressure differential between the liquid/vapor interface and condenser region sufficient to drive the vapor flow. Another possibility is the design of the vapor return path, e.g. the structure of the channels, plenums, manifolds, etc., so as to efficiently return the vapor from the liquid/vapor interface within the wick structure to the condenser region without undue pressure drop or flow resistance. By avoiding undue pressure drop or flow resistance the appropriate operation of the device may be ensured. Indeed, excessive flow resistance or pressure drop may impede or degrade the flow of the vapor out of the device which is undesirable.

To address the problems associated to excessive flow resistance or pressure drop, it is desirable that the vapor enters a flow path with as large a throughput space as possible, thereby minimizing the pressure drop. In the example of FIG. 4 such throughput space may include the space confined between the conducting walls 414, below the wick structure 410 and any additional space available within the structure contributing to enabling the flow of the vapor which may include progressively larger area structures for the vapor to flow through.

In some embodiments, a first vapor return channel may merge and be joined into a second vapor channel of larger cross-sectional area. This may contribute to a better flow of the vapor away from the wick structure thereby providing a more efficient heat transfer.

Although in various embodiments disclosed herein one common liquid supply is shown to be used for providing liquid to the wick structures, it is to be noted that such configuration is only exemplary and the device may likewise include multiple distinct liquid supply sources configured to provide liquid to the wick structures.

Furthermore, as shown in various embodiments disclosed herein, at least some liquid supply channels and some vapor return channels may be disposed alternately from each other. That is to say, a liquid supply channel may be located between two adjacent vapor return channels and a return channel may be located between two adjacent liquid supply channels.

In the various embodiments disclosed herein, it may be preferable to design the size (diameter, length, width or height) of the capillary medium so as to optimize performance, for example to guarantee an adequate liquid flow rate to avoid dry-out, to reduce the thickness of the thin liquid layer, or to avoid overflow of the liquid through the capillary medium in case an additional driving force is used for supplying the liquid.

Figure 5:
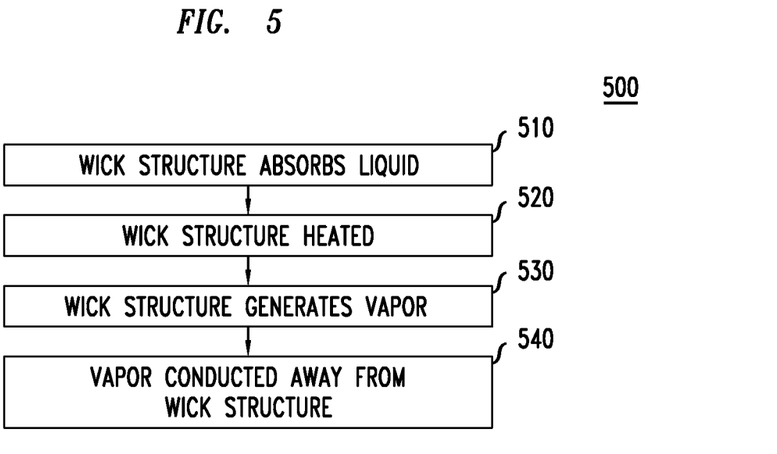
FIG. 5 is an exemplary flow chart representing a method according to some embodiments.

Referring now to FIG. 5, a method 500 is described. At an initial stage, 510, a wick structure absorbs a liquid from a liquid supply source.

At a next stage, 520, the wick structure is heated. At a next stage, 530, the wick structure generates vapor in response to heat received.

At a next stage, 540, the vapor is conducted away from the wick structure using a vapor return channel.

An array of heat conductors may provide a thermal path for transfer of heat from the heat source to the wick structure.

An insulating material may be provided in a region near the liquid supply source to avoid or at least substantially reduce direct transfer of heat from a heat source to the liquid supply source.

The vapor generated transported away from the wick structure may be condensed in a condenser for reuse of the condensed liquid.

The liquid to be used for the cooling process as disclosed herein may be for example water. Another example of a liquid to be used is a dielectric liquid, which in contrast to water, may be harmless to electronics in case of a leak.

One advantage of the disclosed solution is that by using evaporation it allows extremely large heat transfer rates that are typically not possible using existing conduction-based approaches.

Another advantage of the proposed solution is that, at least in some embodiments, it allows for controlling the heat transfer to be maintained in an evaporation regime thereby minimizing or avoiding the creation of bubbles at the liquid/vapor interface within the wick structure. Furthermore, even if in some configurations, bubbles may be created, such bubbles may not significantly degrade the performance of the apparatus. Therefore by using the solution as proposed herein, more stable operation is expected, in contrast to, for example, flow boiling in channels, where dryout can typically occur.

The solution proposed herein is also advantageous as compared to known solutions using single-phase liquid-cooled systems. Such systems often have additional thermal resistance due to the sensible heat rise of the liquid and the lower heat transfer coefficient associated with single phase heat transfer.

Furthermore, the controlled evaporative technique as disclosed herein also has benefits over, for example, flow boiling in microchannels used in known solutions. Due to the significantly narrow diameter of microchannels, it may become possible that a vapor layer is trapped adjacent to the microchannel. This may deleteriously affect heat transfer and even lead to device failure.

It is to be noted that the list of structures corresponding to the claimed elements is not exhaustive and that one skilled in the art understands that equivalent structures can be substituted for the recited structure without departing from the scope of the invention.

It is also to be noted that the order of the actions as recited in the corresponding method claims is not limited to the order as presented and described and may vary without departing from the scope of the invention.

What is claimed is:

1. An apparatus, comprising:
   a liquid supply source;
   a wick structure, the wick structure being configured to absorb liquid from the liquid supply source and generate vapor in response to heat received from a heat source;
   one or more vapor return channels configured for providing a path for conducting said vapor away from the wick structure; and
   an array of heat conductors having a uniform, repeating arrangement in one dimension formed by a first spacing and second spacing which alternate and are different, configured for providing a thermal path for transfer of heat from the heat source to the wick structure,
   wherein a portion of the wick structure is located between walls of two adjacent heat conductors in each first spacing and the one or more vapor return channels are formed between walls of two adjacent heat conductors in each second spacing.

2. The apparatus of claim 1, wherein the wick structure comprises capillary media configured for absorbing the liquid.

3. The apparatus of claim 1, wherein a portion of the wick structure is located between the heat conductors and the liquid supply source.

4. The apparatus of claim 1, wherein the heat conductors comprise capillary media.

5. The apparatus of claim 1, wherein the portion of the wick structure located between walls of two adjacent heat conductors is a capillary medium.

6. The apparatus of claim 5, wherein the capillary medium is a porous membrane.

7. The apparatus of claim 6, wherein the porous membrane has a dimension of 1 micron.

8. The apparatus of claim 1, wherein the heat conductors have a porous structure made of at least one of: sintered metal powder, porous silicon, silicon nanograss, and deposited metal fibers.

9. The apparatus of claim 8, wherein the heat conductors and the wick structure form part of the same structure.

10. The apparatus of claim 1, wherein an insulating material is provided in a region near the liquid supply source to reduce direct transfer of heat from a heat source to the liquid supply source.

11. The apparatus of claim 1, wherein multiple distinct liquid supply sources are configured to provide liquid to the wick structure.

12. The apparatus of claim 1, wherein
    the liquid supply source includes liquid supply channels,
    at least some liquid supply channels and some vapor return channels are disposed alternately from each other.

13. The apparatus of claim 1 further comprising a condenser configured to condense the vapor conducted away from the wick structure for reuse of the condensed liquid.

14. A method, comprising:
    absorbing liquid by a wick structure from a liquid supply source;
    heating the wick structure;
    generating vapor by the wick structure in response to heat received; and
    transferring the vapor away from the wick structure using one or more vapor return channels,
    providing a thermal path for transfer of heat from the heat source to the wick structure via an array of heat conductors having a uniform arrangement in one dimension formed by a first spacing and second spacing which alternate and are different,
    wherein a portion of the wick structure is located between walls of two adjacent heat conductors in each first spacing and the one or more vapor return channels are formed between walls of two adjacent heat conductors in each second spacing.

15. The method of claim 14, wherein absorbing the liquid by the wick structure is performed by capillary media within the wick structure.

16. The method of claim 14, wherein direct transfer of heat from a heat source to the liquid supply source is reduced by an insulating material provided in a region near the liquid supply source.

* * * * *